United States Patent
Kim et al.

(10) Patent No.: US 9,424,129 B2
(45) Date of Patent: Aug. 23, 2016

(54) METHODS AND SYSTEMS INCLUDING AT LEAST TWO TYPES OF NON-VOLATILE CELLS

(71) Applicant: SEAGATE TECHNOLOGY LLC, Cupertino, CA (US)

(72) Inventors: Young Pil Kim, Eden Prairie, MN (US); Antoine Khoueir, Apple Valley, MN (US); Rodney Virgil Bowman, Bloomington, MN (US)

(73) Assignee: Seagate Technology LLC, Cupertino, CA (US)

( * ) Notice: Subject to any disclaimer, the term of this patent is extended or adjusted under 35 U.S.C. 154(b) by 71 days.

(21) Appl. No.: 14/260,865

(22) Filed: Apr. 24, 2014

(65) Prior Publication Data

US 2015/0310937 A1 Oct. 29, 2015

(51) Int. Cl.
| | |
|---|---|
| G06F 12/00 | (2006.01) |
| G06F 13/00 | (2006.01) |
| G06F 11/10 | (2006.01) |
| G11C 11/00 | (2006.01) |
| G11C 16/04 | (2006.01) |
| G11C 16/10 | (2006.01) |

(52) U.S. Cl.
CPC ............ *G06F 11/1072* (2013.01); *G06F 12/00* (2013.01); *G11C 11/005* (2013.01); *G11C 16/0483* (2013.01); *G11C 16/10* (2013.01)

(58) Field of Classification Search
None
See application file for complete search history.

(56) References Cited

U.S. PATENT DOCUMENTS

| | | | |
|---|---|---|---|
| 8,009,471 B2 | 8/2011 | Haines | |
| 8,341,340 B2 | 12/2012 | Rub | |
| 2005/0077567 A1* | 4/2005 | Randolph | G11C 16/0483 257/315 |
| 2009/0052251 A1* | 2/2009 | Kang | G11C 16/0483 365/185.17 |
| 2011/0122694 A1* | 5/2011 | Modave | G06F 21/558 365/185.04 |
| 2012/0001249 A1* | 1/2012 | Alsmeier | H01L 2/11551 257/319 |
| 2012/0023144 A1 | 1/2012 | Rub | |
| 2013/0326115 A1 | 12/2013 | Goss | |
| 2014/0071751 A1 | 3/2014 | Kim | |
| 2014/0126286 A1* | 5/2014 | Higashitani | G11C 11/5628 365/185.03 |
| 2014/0293692 A1* | 10/2014 | Chen | G11C 16/06 365/185.11 |
| 2015/0026387 A1* | 1/2015 | Sheredy | G11C 11/5628 711/103 |
| 2015/0067231 A1* | 3/2015 | Sundarrajan | G06F 3/065 711/103 |
| 2015/0318298 A1* | 11/2015 | Matsudaira | H01L 27/11556 257/314 |

* cited by examiner

*Primary Examiner* — Sean D Rossiter
(74) *Attorney, Agent, or Firm* — Mueting, Raasch & Gebhardt, P.A.

(57) ABSTRACT

Methods and systems that include receiving data to be written to a NAND array in a controller; and writing the data to the NAND array, the NAND array including both type A NAND cells and type B NAND cells, wherein the type A NAND cells and the type B NAND cells have at least one structural difference.

20 Claims, 2 Drawing Sheets ically difficult to obtain in a single flash memory system. FIG.
METHODS AND SYSTEMS INCLUDING AT LEAST TWO TYPES OF NON-VOLATILE CELLS

SUMMARY

Disclosed are methods that include receiving data to be written to a NAND array in a controller; and writing the data to the NAND array, the NAND array including both type A NAND cells and type B NAND cells, wherein the type A NAND cells and the type B NAND cells have at least one structural difference.

Also disclosed are methods that include receiving data to be written to a NAND cell in a controller, the data being designated as type A data or type B data; and writing the data to NAND array, the NAND array including both type A NAND cells and type B NAND cells, wherein the data is written to a type A NAND cell if it has been designated type A data or to a type B NAND cell if it has been designated type B data, wherein the type A NAND cells and the type B NAND cells have at least one structural difference.

Further disclosed are systems that include a non-volatile array, the non-volatile array having both type A NAND cells and type B NAND cells, wherein the type A NAND cells and the type B NAND cells have at least one structural difference; at least one controller configured to store and access data in the type A and type B cells of the array; and at least one host configured to communicate data to the at least one controller.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE FIGURES

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Flash memory is a non-volatile memory which can be of types, NAND and NOR logic gates. NAND flash memory can be used for numerous applications, including for example mobile device memory, laptop memory, USB drives, and solid state drives (SSDs). NAND flash memory is able to hold or persist data in the absence of a power supply. NAND flash memory can exist as arrays, which can be made of blocks of cells. The individual NAND cells are floating gate transistors where the number of electrons on the floating gate determines the threshold voltage (Vt). The threshold voltage represents a logical bit value (e.g., "1" or "0"). When storing or writing data to a group of flash memory transistors the group is typically "erased". The erasing process can include de-charging the floating gates of transistors having charged floating gates and leaving the other transistor floating gates as they were. The repetitive charging and de-charging of the transistors' floating gates can cause (among other things) flash memory to have a limited lifetime.

Figure 1:
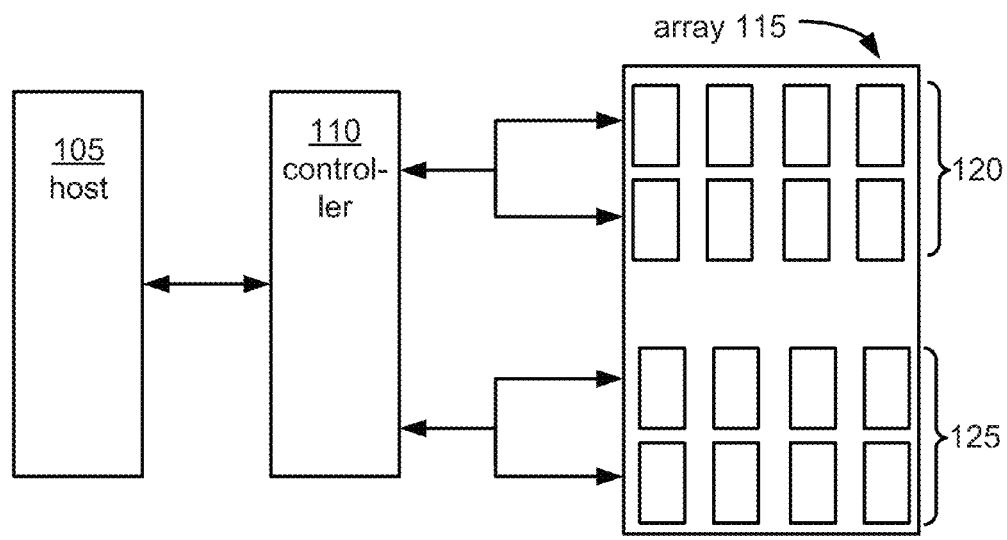
FIG. 1 depicts embodiments of a disclosed system.

Systems and methods disclosed herein provide dual- or multi-type NAND arrays that offer differential treatment of data based on the type of data. For example, the differential treatment of the data can be based on whether a system would benefit from storing the data where its retention would be emphasized or where the persistence of the data would be emphasized. Systems and methods that utilize such preferential treatment may be able to provide flash memory having both longer retention and higher endurance, which are typically difficult to obtain in a single flash memory system. FIG. 1 discloses an example of a disclosed system that includes a non-volatile array 115, at least one controller 110, and at least one host 105. It should be noted that contemplated systems can also include components other than those depicted or discussed herein.

A non-volatile array 115 can include a number of non-volatile memory cells. The individual cells can be grouped into pages, and pages can be grouped into blocks. Non-volatile arrays 115 herein can include single-level cells (SLC) or multi-level cells (MLC). A SLC stores a single bit and the typical convention is to assign the logical bit value of 1 to an erased cell (substantially no accumulated charge) and a logical bit value of 0 to a programmed cell (presence of accumulated charge). An MLC stores multiple bits, such as two bits (e.g., states 11, 01, 00 and 10). Generally, n bits can be stored using $2^n$ storage states. The blocks of cells (whether SLC or MLC) can then be organized into a non-volatile array 115 using rows and columns of the blocks of cells.

Non-volatile arrays utilized herein include at least two structural types of cells. Two structural types of cells are cells that have at least one structural difference between the two types. Whether cells are SLCs or MLCs is not considered a structural difference herein. In some embodiments the non-volatile array can include NAND cells.

Figure 2:
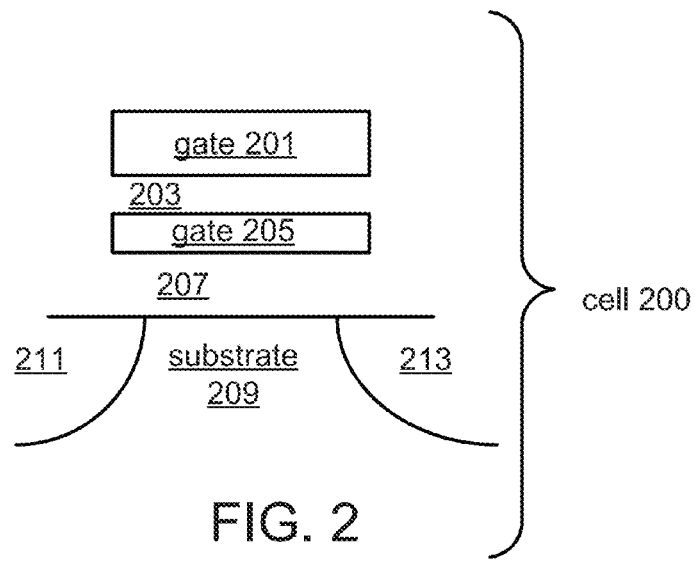
FIG. 2 is a cross section of a NAND type memory cell.

In some embodiments the non-volatile array 115 can include two structural types of cells. The two structural types of cells can be designated as type A and type B cells. FIG. 2 illustrates an example of a NAND cell. The NAND cell 200 includes a control gate 201, a gate dielectric 203, a floating gate 205, and a tunnel layer 207. These structures are formed on a substrate 209. Portions of the substrate 209 have been doped to form a source region 211 and a drain region 213. The number of electrons on the floating gate 205 determines the threshold voltage ($V_t$). The threshold voltage can represent a logical bit value (for example, "1" or "0").

Disclosed non-volatile arrays that utilize NAND cells include at least two types of cells having at least one structural difference. The embodiment of the system depicted in FIG. 1 can include type A cells 120 and type B cells 125. The two types of cells have at least one structural difference. The structural difference in the two types of cells can be a difference in a material of one or more than one structure in the NAND cell, for example. The structural difference in the two types of cells can be a difference in a dimension or shape of one or more than one structure in the NAND cell, for example. The structural difference could also be both a difference in material and a difference in dimension or shape, for example. The structural difference in the two types of cells can be a difference in the location of the cell in the array (for example cells located at the edge of the array versus cells at the center of the array), for example.

In some embodiments a type A cell and a type B cell can include one or more than one layer(s) of a different type of material. For example a type A cell could have a different material as the tunnel layer than a tunnel layer of a type B cell. In some embodiments tunnel layers of type A cells or type B cells can be made of $SiO_2$, silicon nitrides ($Si_3N_4$), high –K dielectrics (including for example $Hf_xO_y$ and $Zr_xO_y$), or combinations thereof (for example oxide-nitride-oxide or oxide-high K-oxide, etc.). In some embodiments a type A cell could have a tunnel layer of SiO and a type B cell could have a tunnel layer including $Si_3N_4$.

Figure 3:
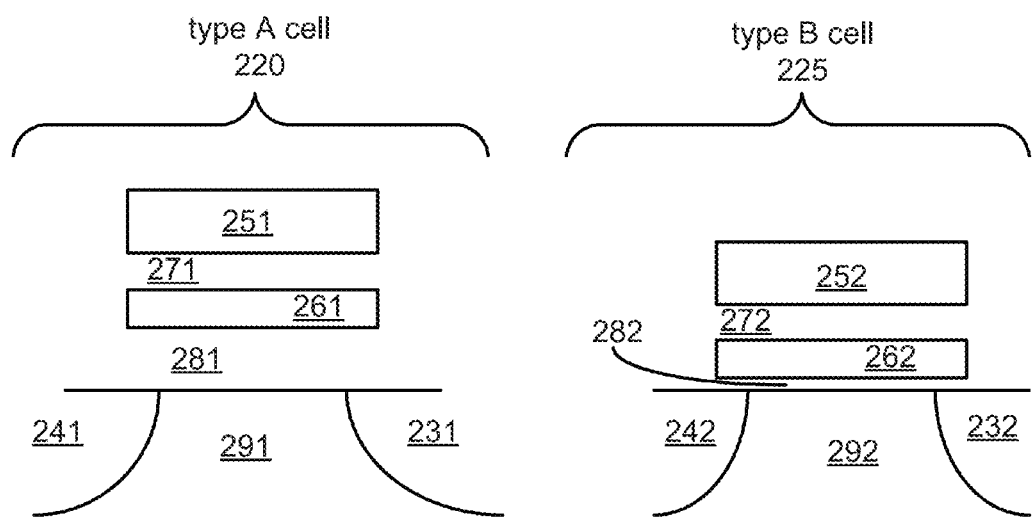
FIG. 3 is a cross section of embodiments of disclosed type A and type B NAND cells.

In some embodiments a type A cell and a type B cell can include structures having different dimensions or shape. In some embodiments the structural difference can include tunnel layers that have different thicknesses. FIG. 3 provides an example of a type A cell 220 and a type B cell 225. The type A NAND cell 220 can include a control gate 251, a gate dielectric 271, a floating gate 261, and a tunnel layer 281. The control gate 251, gate dielectric 271, floating gate 261, and the tunnel layer 281 are positioned on a substrate 291. Portions of the substrate are doped to form the source 241 and the drain 231. The type B NAND cell 225 can include a control gate 252, a gate dielectric 272, a floating gate 262, and a tunnel layer 282. The control gate 252, the gate dielectric 272, the floating gate 262, and the tunnel layer 282 are positioned on a substrate 292. Portions of the substrate are doped to form the source 242 and the drain 232. As depicted in FIG. 3, the tunnel layers 281 and 282 in the two types of cells have different thicknesses.

In some embodiments, type A cells can have tunnel layers that are thicker than the tunnel layers in the type B cells. In some embodiments, the configuration can be reversed from that, so that the type A cells have tunnel layers that are thinner than the tunnel layers in the type B cells. In some embodiments, the type A cells can have tunnel layers that have a thickness that is at least 40 Å. In some embodiments, the type A cells can have tunnel layers that have a thickness that is at least 60 Å. In some embodiments, the type A cells can have tunnel layers that have a thickness that is not greater than 120 Å. In some embodiments, the type A cells can have tunnel layers that have a thickness that is not greater than 100 Å. In some embodiments, the type B cells can have tunnel layers that have a thickness that is at least 10 Å. In some embodiments, the type B cells can have tunnel layers that have a thickness that is at least 30 Å. In some embodiments, the type B cells can have tunnel layers that have a thickness that is not greater than 80 Å. In some embodiments, the type B cells can have tunnel layers that have a thickness that is not greater than 60 Å. In some embodiments, cells indicated as "thicker" can have tunnel layers that are at least 100% thicker than the tunnel layers of cells indicated as "thinner". In some embodiments, cells indicated as "thicker" can have tunnel layers that are at least 50% thicker than the tunnel layers of cells indicated as "thinner".

Different thicknesses of the tunnel layers in a NAND cell may provide different characteristics to the NAND cells. NAND cells having thinner tunnel layers may provide shorter data retention times compared to NAND cells having thicker oxide layers. This may be due to higher leakage currents in the NAND cells having thinner tunnel layers. Higher tunneling currents for the thin oxide layers may require smaller and shorter programming voltage pulses and therefore a lesser probability of having the programming pulse induce defects inside the volume of the thin tunnel layer. It is thought that this may lead to a NAND cell that is more durable. On the other hand the thick tunnel layers may provide longer retention times since the leakage current (charge loss) is smaller than a thin oxide layer. However, the thick tunnel layers could require a larger number of programming pulses with higher voltages. This may lead to more defects and therefore cells that are less durable.

The type A cells and the type B cells can be configured to preferentially store different types of data. In some embodiments the type A cells and the type B cells can be configured to preferentially store hot data and cold data respectively (or vice versa). Hot data is generally data which changes more frequently. Examples of hot data are data that comes from metadata of file systems and structured user files, for example. Cold data is generally data which changes less frequently. Cold data can come from read only (or WORM) files, or bulk and sequential files that often have a number of sectors, for example. Because of the above discussed characteristics of NAND cells having thick and thin tunnel layers respectively, it could be advantageous for NAND cells having tunnel layers designed to be more durable to be used to store hot data. Similarly it could be advantageous for NAND cells having tunnel layers designed for longer retention to be used to store cold data. As such, in some embodiments NAND cells having thicker tunnel layers can preferentially be used to store cold data (type A cells in some embodiments) and NAND cells having thinner tunnel layers can preferentially be used to store hot data (type B cells in some embodiments).

Disclosed systems can also include a host 105. The host 105 may comprise a wide variety of devices, such as one or more of a personal digital assistant (PDA), a workstation, a personal computer, a laptop computer, a mobile telephone, a media player, or any other device capable of transmitting data to or receiving data from a storage media. The host 105 may communicate with the non-volatile memory array 115 or the controller 110 (which would then communicate with the non-volatile memory array 115) via a host interface (not shown herein). The host 105 can communicate with a user and send user data to the controller 110.

In some embodiments, the host 105 can include or be programmed with information about data to be stored in the non-volatile array 115. Similarly, the host 105 can gather information about the data to be stored in the non-volatile array 115 once the host generates. The host 105 can also be capable of tagging data with information about the data. For example, the host can be capable of tagging data with an indication that it is considered either "hot data" or "cold data".

Disclosed systems can also include a controller 110. The controller 110 can be configured to control or manage the storing or encoding of data to the non-volatile array 115. More specifically the controller 110 can be configured to perform a number of tasks, including executing instructions that allow the controller to read data from and write data to the non-volatile memory array 115. A controller 110 can include for example hardware, such as one or more processors, microprocessors, digital signal processors (DSP), application-specific integrated circuits (ASICs), field programmable gate arrays (FPGAs), or any other equivalent integrated or discrete logic circuitry. In some embodiments a computing device (not shown) coupled to the system may implement the functionality described to the controller 110. For example, the system may not include controller 110, and instead a software driver implemented by an operating system of the computing device (e.g., host) may perform the functions of the controller 110.

Controller 110 can optionally utilize buffer memory (not shown herein) when storing or retrieving data from the non-volatile array 115. The controller 110 receives data from the host and distributes the data to the type A cells or type B cells. Whether the data is stored in a type A cell or a type B cell can be determined based on information from the host, information connected to the data itself, information from the controller, or any combination thereof.

Systems can have various components of the system located in various locations. For example the controller could be associated with or located inside a single NAND die, inside a NAND package as an independent die along with the other NAND dies, or as an independent package on a circuit board for the solid-state device (SSD).

Also disclosed herein are methods. Disclosed methods, such as illustrative method 300 shown in FIG. 4, can include steps of receiving data 305 to be written to a NAND array in a controller, and writing the data 310 to the NAND array. The data can be sent to the controller from a host for example. In some embodiments the data can be sent to the controller along with information about the data. For example the data can be accompanied by a designation of whether the data should be stored in type A NAND cells or type B NAND cells. The designation, if the data is accompanied by such can have been made by the host.

An example of a disclosed method includes receiving data to be written to a NAND array in a controller, and writing data to the NAND array where the NAND array includes type A NAND cells and type B NAND cells wherein there is at least one structural difference between the type A NAND cells and the type B NAND cells. In such embodiments the data can be written to the type A NAND cell or the type B NAND cell based on the capacity of the NAND array, or any regularly utilized data distribution scheme.

Figure 4:
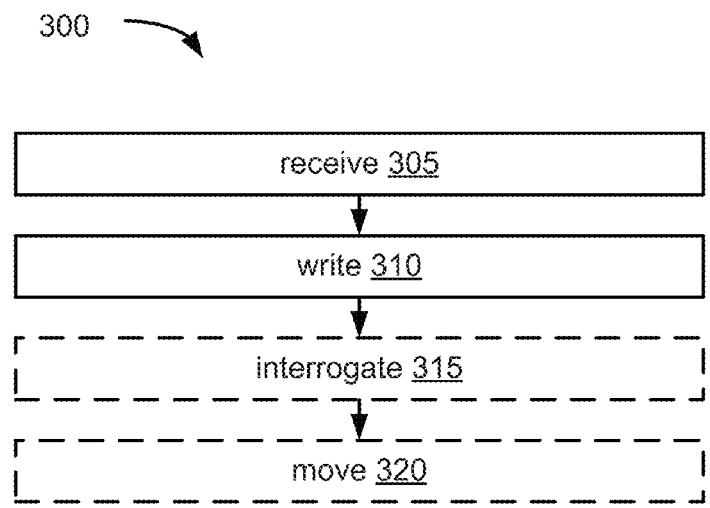
FIG. 4 is a flow chart depicting disclosed methods.

In embodiments such as those just discussed, advantages that may be gained by having a particular type of data in a particular type of cell may not be gained the first time the data is written to the NAND array. As such, an optional step such embodiments can include is interrogating data 315 stored in the NAND array, as shown in FIG. 4. In the specific context where the disclosed NAND array is configured to delineate data storage based on hot or cold data, the optional step of interrogating data stored in the NAND array can include determining how long the data in question has been stored in the particular cell, how often the data in question has been accessed, or some combination thereof. Such interrogation can be specifically designed therefore to determine whether a particular data bit is hot data or cold data. In some embodiments such an optional interrogation step can be undertaken by the controller for example. After the optional interrogation step, data that is incorrectly placed can be moved 320 which is shown as an optional step in FIG. 4. Data can be characterized as incorrectly placed if the interrogation step determines it is hot data and it is placed in a memory cell preferentially configured for cold data, or is cold data and it is placed in a memory cell preferentially configured for hot data.

An example of another disclosed method includes receiving data to be written to and NAND array in a controller, and writing data to the NAND array where the NAND array includes a type A NAND cell and a type B NAND cell, and wherein the data can be written to the type A NAND cell or the type B NAND cell based on information about the data. The information about the data can be received from a host, for example. The information about the data can be determined by the host based on an algorithm for making such a determination, based on preset information about data, or some combination thereof. For example, a host can designate data as type A or type B data.

In embodiments such as those just discussed, advantages that may be gained by having a particular type of data in a particular type of cell may be gained the first time the data is written to the NAND array. Methods such as these may however still benefit from an optional step of interrogating the data stored in the NAND array. Benefits could arise in instances where the data was incorrectly determined to be one type or the other. In the specific context where the disclosed NAND array is configured to delineate data storage based on hot or cold data, the optional step of interrogating data stored in the NAND array can include determining how the data was characterized initially, determining how long the data in question has been stored in the particular cell, how often the data in question has been accessed, or some combination thereof. Such interrogation can be specifically designed therefore to determine whether a particular data bit is hot data or cold data. In some embodiments such an optional interrogation step can be undertaken by the controller for example. After the optional interrogation step, data that is incorrectly placed can be moved. Data can be characterized as incorrectly placed if the interrogation step determines it is hot data and it is placed in a memory cell preferentially configured for cold data, or is cold data and it is placed in a memory cell preferentially configured for hot data.

An example of another disclosed method includes receiving data to be written to and NAND array in a controller, and writing data to the NAND array where the NAND array includes a type A NAND cell and a type B NAND cell, and wherein the data can be written to the type A NAND cell or the type B NAND cell based on an algorithm stored in the controller. In the specific context where the disclosed NAND array is configured to delineate data storage based on hot or cold data, the algorithm can include determining the type of data it is, the available capacity of each type of NAND cell array, or some combination thereof. Such algorithms can be specifically designed therefore to determine whether a particular data bit is hot data or cold data.

In embodiments such as those just discussed, advantages that may be gained by having a particular type of data in a particular type of cell may be gained the first time the data is written to the NAND array. Methods such as these may however still benefit from an optional step of interrogating the data stored in the NAND array. Benefits could arise in instances where the data was incorrectly determined to be one type or the other. In the specific context where the disclosed NAND array is configured to delineate data storage based on hot or cold data, an optional step of interrogating data stored in the NAND array can include determining how the data was characterized initially, determining how long the data in question has been stored in the particular cell, how often the data in question has been accessed, or some combination thereof. After the optional interrogation step, data that is incorrectly placed can be moved. Data can be characterized as incorrectly placed if the interrogation step determines it is hot data and it is placed in a memory cell preferentially configured for cold data, or is cold data and it is placed in a memory cell preferentially configured for hot data.

An example of other disclosed methods include receiving data to be written to a NAND cell in a controller, the data being designated as type A data or type B data, and writing the data to an NAND array, the NAND array including both type A NAND cells and type B NAND cells, wherein the data is written to a type A NAND cell if it has been designated type A data or to a type B NAND cell if it has been designated type B data. Such a method can include an optional step of interrogating the data in the NAND array to determine if the data is correctly stored. If the optional step is undertaken and the data is incorrectly stored, the data can be moved to the correct location.

One skilled in the art will appreciate that the articles, devices and methods described herein can be practiced with embodiments other than those disclosed. The disclosed embodiments are presented for purposes of illustration and not limitation. One will also understand that components of the articles, devices and methods depicted and described with regard to the figures and embodiments herein may be interchangeable.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, "top" and "bottom" (or other terms like "upper" and "lower") are utilized strictly for relative descriptions and do not imply any overall orientation of the article in which the described element is located.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. For example, a conductive trace that "comprises" silver may be a conductive trace that "consists of" silver or that "consists essentially of" silver.

As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Use of "first," "second," etc. in the description above and the claims that follow is not intended to necessarily indicate that the enumerated number of objects are present. For example, a "second" substrate is merely intended to differentiate from another infusion device (such as a "first" substrate). Use of "first," "second," etc. in the description above and the claims that follow is also not necessarily intended to indicate that one comes earlier in time than the other.

Thus, embodiments of methods and systems including at least two types of non-volatile cells are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

The invention claimed is:

1. A method comprising:
   receiving data to be written to a NAND array in a controller; and
   writing the data to the NAND array, the NAND array comprising both type A NAND cells and type B NAND cells,
   wherein the type A NAND cells and the type B NAND cells have at least one structural difference, wherein the type A NAND cells and the type B NAND cells are of a same configuration, wherein the same configuration is either a single level cell configuration or a multilevel cell configuration.

2. The method according to claim 1, wherein the data is written either to a type A NAND cell or a type B NAND cell of a NAND array based only on the capacity of the NAND array.

3. The method according to claim 2 further comprising interrogating data stored in the type A NAND cells and the type B NAND cells to determine if type A data is stored in type A NAND cells and type B data is stored in type B NAND cells.

4. The method according to claim 3 further comprising moving type A data stored in type B NAND cells to type A NAND cells and type B data stored in type A NAND cells to type B NAND cells.

5. The method according to claim 1, wherein the data is written either to a type A NAND cell or a type B NAND cell of the NAND array based on information from a host.

6. The method according to claim 5, wherein the data received in the controller was designated type A or type B by the host.

7. The method according to claim 1, wherein the data is written either to a type A NAND cell or a type B NAND cell of the NAND array based on an algorithm stored in the controller.

8. The method according to claim 7 further comprising interrogating data stored in the type A NAND cells and the type B NAND cells to determine if type A data is stored in type A NAND cells and type B data is stored in type B NAND cells.

9. The method according to claim 8 further comprising moving type A data stored in type B NAND cells to type A NAND cells and type B data stored in type A NAND cells to type B NAND cells.

10. The method according to claim 1, wherein the type A data is cold data and the type B data is hot data.

11. A method comprising:
    receiving data to be written to a NAND cell in a controller, the data being designated as type A data or type B data; and
    writing the data to NAND array, the NAND array comprising both type A NAND cells and type B NAND cells, wherein the data is written to a type A NAND cell if it has been designated type A data or to a type B NAND cell if it has been designated type B data, wherein the type A NAND cells comprise tunnel layers of a first material and the type B NAND cells comprise tunnel layers of a second material being different than the first material.

12. The method according to claim 11 further comprising interrogating data stored in the type A NAND cells and the type B NAND cells to determine if type A data is stored in type A NAND cells and type B data is stored in type B NAND cells.

13. The method according to claim 12 further comprising moving type A data stored in type B NAND cells to type A NAND cells and type B data stored in type A NAND cells to type B NAND cells.

14. A system comprising:
- non-volatile array, the non-volatile array comprising both type A NAND cells and type B NAND cells,
- wherein the type A NAND cells and the type B NAND cells have at least one structural difference, wherein the type A NAND cells and the type B NAND cells are of a same configuration, wherein the same configuration is either a single level cell configuration or a multilevel cell configuration;
- at least one controller configured to store and access data in the type A and type B cells of the array; and
- at least one host configured to communicate data to the at least one controller;
- wherein the controller writes data communicated from the at least one host to one of a type A NAND cell and a type B NAND cell of a NAND array based only on the capacity of the NAND array.

15. The system according to claim 14, wherein the type A NAND cells have tunnel layers that are a first material and the type B NAND cells are a second material and the first material and the second material are not the same.

16. The system according to claim 14, wherein the type A NAND cells have tunnel layers that have a different thickness than the tunnel layers of the type B NAND cells.

17. The system according to claim 16, wherein the type A NAND cells have a thicker tunnel layer than do the type B NAND cells.

18. The system according to claim 16, wherein the type A NAND cells have tunnel layers that are at least 50% thicker than the tunnel layers of the type B NAND cells.

19. The system according to claim 17, wherein the type A NAND cells are configured to preferentially store cold data and the type B NAND cells are configured to preferentially store hot data.

20. The system according to claim 14, wherein the type A NAND cells have tunnel layers that have a thickness from 40 Å to 120 Å; and the type B NAND cells have tunnel layers that have a thickness from 10 Å to 80 Å.

* * * * *